United States Patent
Zhang

(12) 
(10) Patent No.: US 6,310,495 B1
(45) Date of Patent: Oct. 30, 2001

(54) CLOCK WAVE NOISE REDUCER

(75) Inventor: Johnny Q Zhang, San Jose, CA (US)

(73) Assignee: Hewlett Packard Company, Palo Alto, CA (US)

(*) Notice: Subject to any disclaimer, the term of this patent is extended or adjusted under 35 U.S.C. 154(b) by 0 days.

(21) Appl. No.: 09/504,598

(22) Filed: Feb. 15, 2000

(51) Int. Cl.$^7$ .................................................. G01R 19/00
(52) U.S. Cl. ............................ 327/52; 327/108; 330/258
(58) Field of Search .................................. 327/108, 310, 327/313, 52, 292, 293, 551, 565; 330/252, 253, 258; 323/293, 352

(56) References Cited

U.S. PATENT DOCUMENTS

| | | | |
|---|---|---|---|
| 4,618,832 | * 10/1986 | Schenck | 330/254 |
| 5,381,112 | * 1/1995 | Rybicki et al. | 330/253 |
| 5,568,089 | * 10/1996 | Maru | 330/253 |
| 5,729,178 | * 3/1998 | Park et al. | 330/258 |

\* cited by examiner

*Primary Examiner*—Timothy P. Callahan
*Assistant Examiner*—An T. Luu

(57) ABSTRACT

A clock circuit on an integrated circuit chip includes a driver having an output for deriving an output clock wave responsive to a clock wave of a clock wave source, a clock line having a first end coupled to the output of the driver, and a receiver having an input coupled to a second end of the clock line. The receiver has a resistive input impedance causing the clock line carrying the output clock wave to the input of the receiver to present to the driver output an impedance having a resistance-capacitance time constant that is a relatively small fraction of a period of the clock wave.

7 Claims, 2 Drawing Sheets

CLOCK WAVE NOISE REDUCER

FIELD OF THE INVENTION

The present invention further relates to integrated circuit clock circuitry, and more particularly to such clock circuitry including a differential driver for deriving a pair of complementary clock waves coupled to a differential clock wave receiver via a pair of clock lines carrying complementary clock waves from the driver to a pair of differential inputs of the receiver. Another aspect of the invention relates to a circuit for removing common mode components from a pair of complementary bi-level waveforms wherein the circuit includes a differential amplifier for subtracting the common mode components during first half cycles of the waveform and for supplying an output terminal with a power supply voltage during second half cycles of the waveforms.

BACKGROUND OF THE INVENTION

An integrated circuit (IC) chip frequently includes clock trees to distribute clock waves to physically separated destination (i.e., receiver) circuits. Typically, an off-chip, external clock source provides clock waves to a plurality of clock tree branches or segments resident on the IC chip. Each branch or segment of the clock tree carries clock waves to a respective one of the physically separated destination circuits.

FIG. 1 is a circuit diagram of a conventional clock tree distribution segment for distributing clock waves on an IC chip carrying the segment. The circuit of FIG. 1 is on an IC chip and includes spaced clock wave driver 4 and clock wave receiver 6 as well as wire or clock line 2 that is connected between the driver and receiver. Driver 4 responds to clock waves in the form of a sequence of clock pulses derived from a clock source (not shown) that, in some instances, is not on the IC chip. Driver 4 derives at output terminal 10 a sequence of amplified clock waves in the form of clock pulses. Terminal 10, at the junction of the drains of complementary field effect transistors 11 and 13 having gates driven in parallel by the clock pulses from clock input 12, is connected to a first end of single ended line 2 to supply the derived clock pulses to the first end of the clock line. The clock waves traverse clock line 2 and exit at a second end thereof to be injected into input terminal 14 of clock wave receiver 6.

Receiver 6 includes complementary FETs 17 and 19 having gates driven in parallel by the pulses at terminal 14 of line 2 and drains connected to a common terminal 16, where the output is derived. The FETs of driver 4 and receiver 6 are connected across power supply rails connected to DC power supply terminals +Vdd and ground so the sources of N-channel FETs 11 and 17 are grounded and the sources of P-channel FETs 13 and 19 are at +Vdd; in the typical prior art circuit, Vdd=3 Volts. The clock pulses propagating along line 2 are attenuated because of the substantial impedance of the line, are phased delayed because of the substantial resistance-capacitance (RC) time constant of the line, and are subject to noise on the line which is coupled to terminal 14. Receiver 6 responds to the degraded clock pulses at terminal 14 to amplify the pulses almost to the rail-to-rail voltages +Vdd and ground.

Clock circuitry on the IC chip is subject to noise and problems associated therewith. Particularly, noise is introduced onto the single ended clock line coupled between the single ended driver and single ended receiver pair associated with that clock line. The amount of noise coupled to clock lines increases with increases in IC chip size, since the clock lines are necessarily longer in the larger chips.

In the conventional, prior art clock circuit of FIG. 1, noise introduced onto clock line 2 corrupts the integrity of the clock pulses propagating between driver 4 and receiver 6. Since receiver 6 is not inherently immune to noise and does not provide noise correction or elimination, clock line noise arriving at input terminal 14 of receiver 6 is simply coupled to the output of receiver 6, and/or the noise translates to clock jitter at the receiver output terminal 16. Clock pulses with substantial noise components superimposed thereon arrive at destination circuits responsive to the output of receiver 6. Under such conditions, the destination circuits of the IC chip usually do not have optimum performance. Thus, there is a need to eliminate or substantially reduce the effects of noise introduced onto the clock lines between the driver and receiver of a clock circuit, to provide a substantially noise free clock wave to a destination circuit on the IC chip.

In summary, there is a need to provide IC chip clock circuitry that both reduces clock skew and/or minimizes the deleterious effects caused by noise coupled onto clock lines in the chip. There is a further need to achieve these goals in the environment of large IC chips operating at high frequencies.

SUMMARY OF THE INVENTION

An object of the present invention is to provide new and improved clock circuitry arranged to minimize the deleterious effects caused by noise coupled onto clock lines in an IC chip.

Another object of the invention is to provide a new and improved circuit for removing common mode components from a pair of complementary bi-level waveforms.

In one aspect of the present invention, a clock circuit on an IC chip includes a driver having first and second outputs for respectively deriving first and second complementary clock waves responsive to a clock wave of a clock wave source. A receiver of the clock circuit includes first and second inputs. The clock circuit includes first and second clock lines connected respectively between the first and second outputs of the driver and the first and second inputs of the receiver. The first and second clock lines are arranged on the IC chip so that noise coupled to one of the first and second clock lines tends to be coupled to the other clock line. The receiver is constructed and arranged to substantially reject noise of like amplitude and polarity coupled to the first and second inputs of the receiver by the first and second clock lines.

In another aspect of the present invention, a clock circuit on an IC chip includes a driver having first and second outputs for respectively deriving first and second complementary clock waves responsive to a clock wave of a clock wave source. A receiver of the clock circuit includes first and second inputs. First and second clock lines are respectively connected between the first and second outputs of the driver and the first and second inputs of the receiver. The receiver is constructed and arranged to amplify clock waves having relatively low amplitudes at the first and second inputs substantially to high and low power supply voltages of the IC chip. An amplified clock wave is derived at an output of the receiver. The amplified clock wave has clock wave transitions substantially coincident with clock wave transitions of the clock wave of the clock wave source.

Another aspect of the invention relates to a circuit for removing common mode components from first and second complementary bi-level waveforms. The circuit includes first and second input terminals respectively responsive to the first and second waveforms and a differential amplifier connected to the first and second input terminals and to first and second DC power supply terminals. The differential amplifier is arranged so that during first half cycles of the waveforms, the common mode components are subtracted therein and during second half cycles of the waveforms an output terminal of the amplifier is supplied with one of the DC power supply voltages. Preferably two such similar differential amplifiers are provided. The first differential amplifier is arranged so that during the first half cycles the common mode components are subtracted therein. During the second half cycles the first amplifier supplies a first output terminal with a first DC power supply voltage. The second differential amplifier is arranged so that during the second half cycles the common mode components are subtracted therein. During the first half cycles the second amplifier supplies a second output terminal with a second DC power supply voltage. Such differential amplifiers are preferably included in the receiver for the clock waves.

In the preferred embodiment, each of the differential amplifiers includes first, second and third transistors having the same first conductivity type, as well as fourth and fifth transistors having the same second conductivity type. Each of the transistors includes a control electrode and a path having an impedance controlled by voltage at the control electrode. The paths of the first and fourth transistors are connected in series to form a first branch. The paths of the second and fifth transistors are connected in series to form a second branch. One end of each of the first and second branches is connected to the first power supply terminal. A second end of each of the first and second branches is connected to the path of the third transistor. The control electrodes of the first and second transistors of the first differential amplifier are respectively responsive to voltages at the first and second input terminals. The control electrodes of the first and second transistors of the second differential amplifier are respectively responsive to voltages at the second and first input terminals. Preferably, the control electrodes of the third, fourth and fifth transistors of each of the differential amplifiers are preferably connected together, and the fourth transistor of each of the differential amplifiers is connected as a diode.

A terminal between the paths of the first and fourth transistors of the first amplifier is preferably connected to be at the same potential as a terminal between the paths of the second and fifth transistors of the second amplifier. A terminal between the paths of the first and fourth transistors of the second amplifier is connected to be at the same potential as a terminal between the paths of the second and fifth transistors of the first amplifier.

The above and still further objects, features and advantages of the present invention will become apparent upon consideration of the following detailed description of one specific embodiment thereof, especially when taken in conjunction with the accompanying drawings.

BRIEF DESCRIPTION OF THE DRAWING

As described.

DETAILED DESCRIPTION OF THE DRAWING

Figure 2:
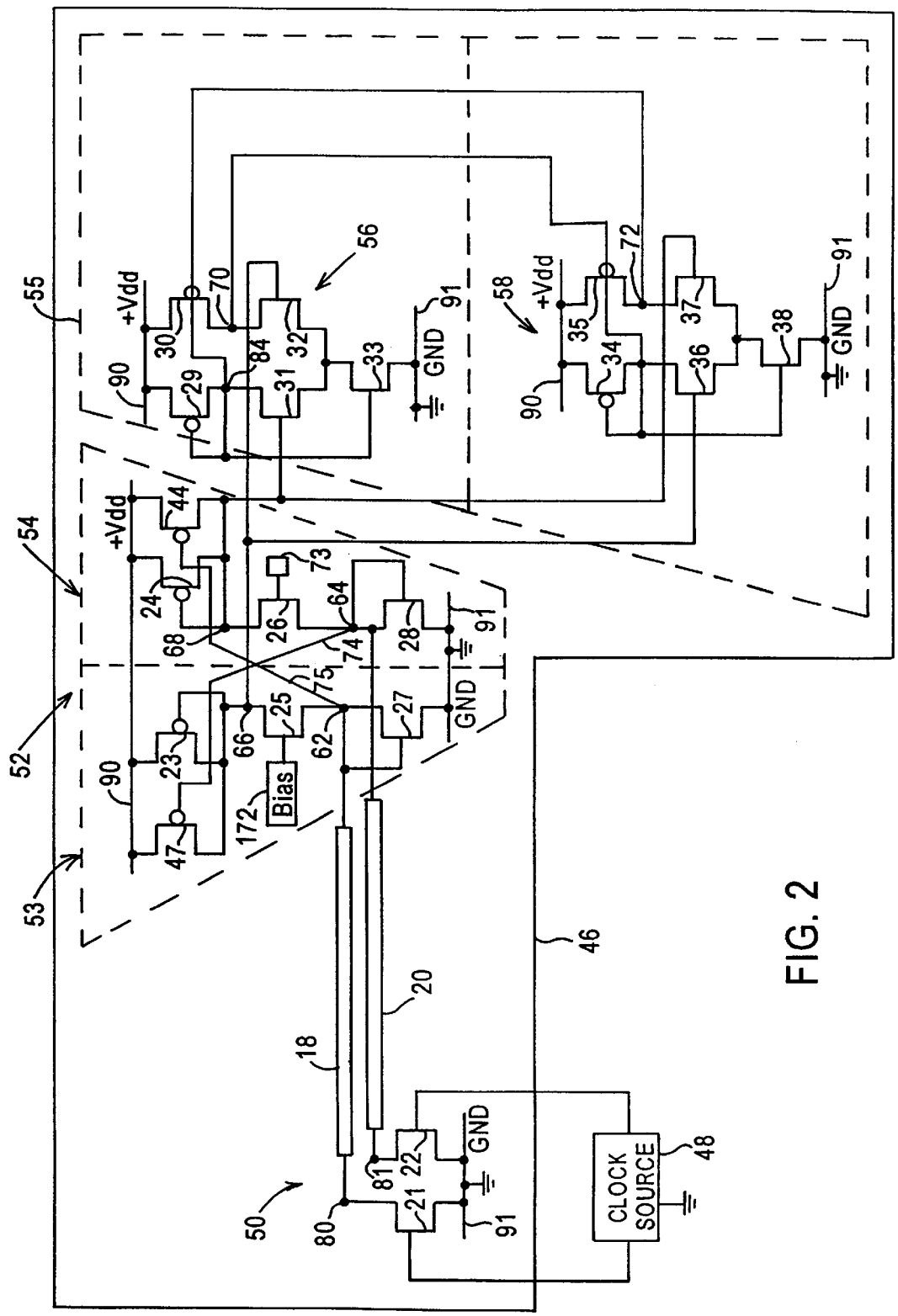
FIG. 2 is circuit diagram of an embodiment of a clock circuit on an IC chip in accordance with the present invention.

FIG. 2 is a circuit diagram of CMOS clock circuitry carried by integrated circuit chip 46; the clock circuitry illustrated in FIG. 2 distributes clock pulse trains to other circuitry (not shown) on the integrated circuit chip. The clock circuitry of FIG. 2 responds to clock pulse trains derived from clock pulse source 48, which can be but is not necessarily on integrated circuit chip 46. Clock source 48 supplies complementary bi-level clock pulse trains to the clock circuitry on integrated circuit chip 46. A typical frequency for the clock pulse train that source 48 supplies to the circuitry on chip 46 is one GHz, although the illustrated clock circuitry can operate in response to other clock frequencies which are higher and lower than one GHz.

The integrated clock circuitry of FIG. 2 on chip 46 includes clock pulse driver 50 and clock pulse receiver 52, spaced from each other and connected to each other by clock lines 18 and 20. Chip 46 also includes amplifier 55, which responds to relatively low amplitude bi-level clock pulse waves derived by receiver 52 to amplify these waves substantially to DC voltages at positive rail 90 and ground (i.e., negative) rail 91 of a DC power supply source driving the integrated circuits on chip 46.

Driver 50 responds to the complementary clock pulse trains supplied to it by clock source 48 to supply complementary clock pulse trains to lines 18 and 20, thence receiver 52. Lines 18 and 20 are arranged as described to be responsive to common mode noise, i.e., noise having the same polarity and substantially the same amplitude. Receiver 52 responds to the complementary clock trains supplied to it by lines 18 and 20 to drive amplifier 55, which is arranged to eliminate the common mode noise. Amplifier 55 derives complementary clock pulse wave trains that are substantial replicas of the clock pulse trains source 48 applies to driver 50. Leading and trailing edges of the clock pulse trains derived by amplifier 55 occur at substantially the same times as leading and trailing edges of the clock pulse trains source 48 applies to driver 50.

Figure 1:
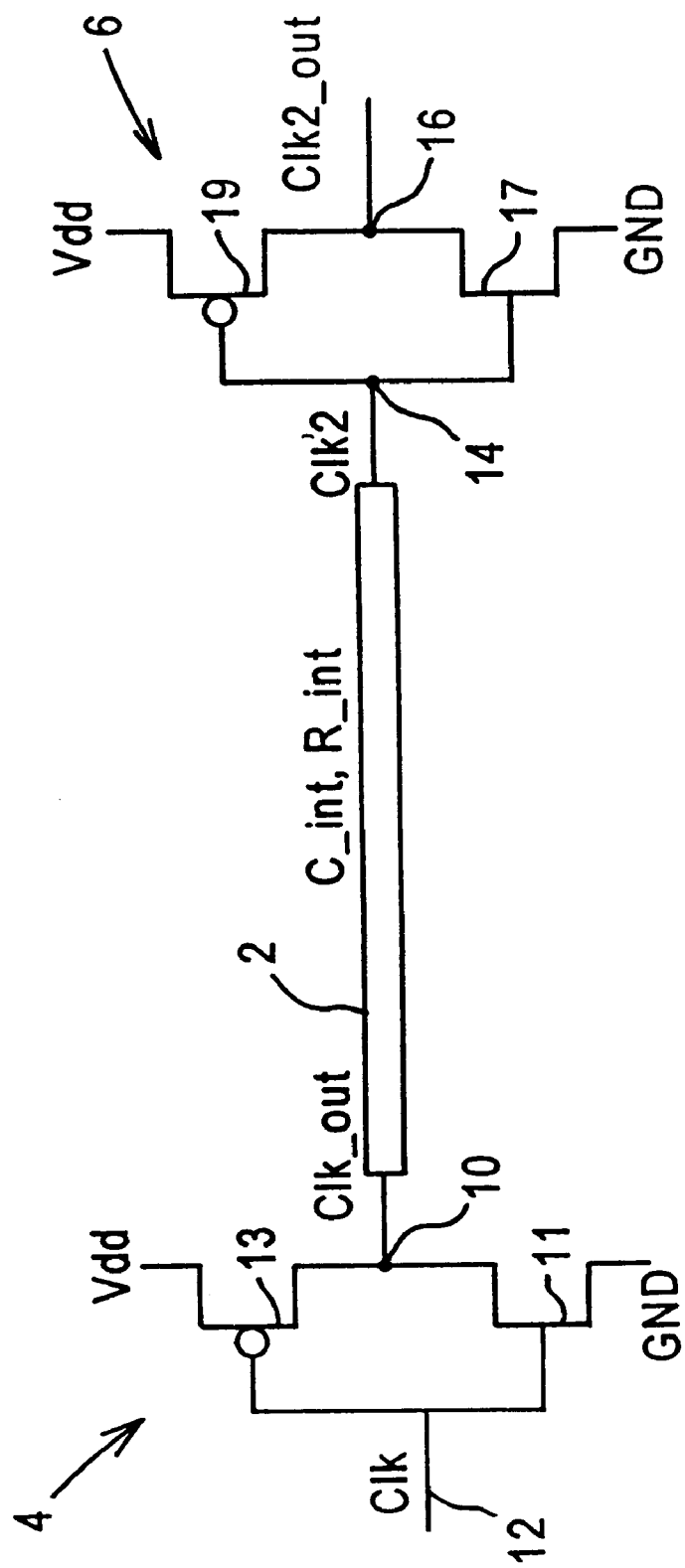
FIG. 1 is a circuit diagram of a conventional clock circuit on an IC chip.

The elimination of noise from the clock pulse trains derived by amplifier 55 of the circuit of FIG. 2 is in contrast to the single ended arrangement of FIG. 1 wherein the output of receiver 6 is subject to substantial noise variations on line 2. Because of the high frequency, such as one GHz, that clock pulse train source 48 derives and the low DC power supply voltage (such as 1.3 volts) driving the circuitry of FIG. 2, the noise on lines 18 and 20 is likely to introduce (1) frequency components that are about the same as the clock frequencies, and (2) amplitude variations that are about the same as the DC power supply voltage. The complementary arrangement of driver 50, wires or leads 18 and 20, receiver 52 and amplifier 55 substantially eliminates these common mode noise components and variations from the receiver clock pulse wave trains.

Driver 50, receiver 52 and clock lines 18 and 20 cause a much lower clock skew to be introduced than is introduced by the circuitry of FIG. 1 by presenting to the output of driver 50 an impedance having an RC time constant that is a relatively small fraction (e.g., about 10%) of the duration of a cycle of the clock wave propagating along clock lines 18 and 20. The substantial reduction in the RC time constant presented to the output of driver 50 is attained by substantially decreasing the effective resistive input impedance, Rrcv, of receiver 52 without decreasing the amplitude of the clock pulse wave trains driver 50 derives.

In the prior art clock circuitry of FIG. 1, receiver 6 has a high resistive input impedance, Rrcv, between terminal 14 and ground; the value of Rrcv between terminal 14 and ground is typically on the order of a megohm. In contrast, receiver 52 presents to driver 50 a resistive input impedance in the range of approximately 10 to 60 ohms. The drastically reduced resistive input impedance that receiver 52 and lines 18 and 20 present to driver 50, compared to the impedance line 2 presents to driver 4 (FIG. 1), enables the circuit of FIG. 2 to have a substantial reduction in clock skew compared to the circuit of FIG. 1. Because of the low resistive impedance receiver 52 presents to lines 18 and 20, lines 18 and 20 present to driver 50 an RC time constant on the order of about 100 picoseconds (ps); this is in contrast to the approximately one microsecond RC time constant line 2 presents to driver 4. Hence, the RC time constant presented to the output terminals of driver 50 is a relatively small fraction (such as 10%) of the period of one cycle of the clock pulse wave train source 48 derives. Because lines 18 and 20 and receiver 52 present a short RC time constant to the output terminals of driver 50, substantial variations in the resistance and capacitance of the impedance seen by the driver do not have a substantial effect on the time displacement between the leading and trailing edges of the clock wave trains source 48 and amplifier 55 derive.

It is desirable for the resistive input impedance of receiver 52 to be at least 10 ohms to prevent oscillations that would otherwise occur. The oscillations would occur if the resistive input impedance were less than 10 ohms because clock lines 18 and 20 have capacitive and inductive reactances tending to cause oscillations on the lines in response to leading and trailing edge transitions of the clock pulses propagating along the lines. A resistive input impedance of about 10 ohms or larger is sufficiently large to substantially dampen such oscillations.

Driver 50 includes N-channel field effect transistors (FETs) 21 and 22 having source drain paths respectively connected between output terminals 80 and 81 of the driver and a terminal connected to ground rail 91, i.e., the low DC power supply voltage, applied to the clock circuitry of chip 46. FETs 21 and 22 include gates connected in DC circuits to the complementary outputs of clock pulse wave train source 48. FETs 21 and 22 invert the complementary clock waves source 48 derives so that when the input clocks to the gates of FETs 21 and 22 are respectively high and low, the voltages at the drains of FETs 21 and 22 are respectively low and high, and vice versa. Clock pulse trains at output terminals 80 and 81 are respectively injected into first ends of clock lines 18 and 20.

Clock lines 18 and 20 extend along substantially parallel, closely spaced paths between output terminals 80 and 81 of driver 50 to input terminals 62 and 64 of receiver 52. If one of clock lines 18 and 20 has a length of about 400 micrometers, as is typical, it presents to one of terminals 80 and 81 typical resistive and capacitive values of about 5 ohms and two picofarads respectively. Because lines 18 and 20 run substantially parallel and in close proximity to each other, localized, common mode noise on integrated circuit chip 46 is coupled to both lines. The common mode noise coupled to clock lines 18 and 20 is substantially reduced and is virtually eliminated at output terminals 70 and 72 of amplifier 55.

Each of lines 18 and 20 has a second end respectively connected to input terminals 62 and 64 of receiver 52. Receiver 52 includes first and second input buffers 53 and 54, respectively responsive to the clock pulses at terminals 62 and 64 at the second ends of lines 18 and 20.

Buffers 53 and 54 are identical to each other, but are responsive to the complementary clock pulse trains at terminals 62 and 64. Hence, a description of buffer 53 suffices for buffer 54. Because of the complementary nature of the clock pulses driving buffers 53 and 54, buffer 53 derives a relatively low voltage output clock wave at its output terminal 66 while buffer 54 derives a relatively high voltage output wave at its output terminal 68 and vice versa.

Buffer 53 includes N-channel FET 27, connected as a back biased diode between terminal 62 and ground, by virtue of its gate and drain (which form the diode cathode) being connected together at terminal 62 and its source (which forms the diode anode) being connected to ground rail 91. The diode formed by FET 27 assists in preventing the voltage at terminal 62 from (1) dropping below a predetermined value, e.g., about 300 millivolts, and (2) going above a predetermined value, e.g., about 500 millivolts. The voltages at terminal 62 are thus approximately 500 millivolts and approximately 300 millivolts while the source drain impedance of FET 21 is relatively high and low, respectively.

DC current is supplied to terminal 62 and the diode formed by FET 27 by N-channel field effect transistor 25 having a source drain path connected between terminals 62 and 66 such that the drain and source of FET 25 are respectively connected to terminals 62 and 66. DC source 172 biases the gate of FET 25 relative to the source of the FET to control the amplitude of the DC current FET 25 supplies to terminal 62. DC bias source 172 is preferably a tap on a capacitive voltage divider (not shown) connected between positive DC power supply rail 90 and ground rail 91. The bias voltage DC bias source 172 applies to the gate of FET 25 maintains the FET in a forward biased conducting state throughout the operation of the clock circuitry on integrated circuit chip 46.

FET 25 has a relatively high transconductance, $g_m$, a result achieved by forming FET 25 so it has a relatively wide gate width, i.e., a gate width that is about 5 to 10 times the width of the gates of any of FETs 21, 27 or 47. As a result of the high $g_m$, the source drain path of field effect transistor 25 can be considered as a constant DC current source for any particular value of its source gate bias voltage, i.e., the difference in voltage between terminal 62 and the bias voltage source 172 supplies to the gate of FET 25.

DC current for the source drain path of FET 25 is derived from the positive DC power supply voltage at rail 90 via the source drain path of at least one of P-channel FETs 23 and 47. FET 23 is connected as a diode in shunt with the source drain path of FET 47 since the gate and drain of FET 23 have a common connection to terminal 66 to form the diode anode. The source of FET 23 is connected to the positive DC power supply voltage at rail 90 to form the diode cathode.

The source drain path of FET 47 is connected in parallel with the diode formed by FET 23 because the source and drain of FET 23 are respectively connected to rail 90 and terminal 66. The gate of FET 47 is connected to terminal 64 to be responsive to voltage variations resulting from the clock pulse wave train on lead 20. Hence, the source drain impedance of FET 47 is high while the source drain impedance of FET 22 is high while clock source 48 derives the low level clock half cycles. Because of the parallel connections of FETs 23 and 47 to the drain of FET 25, a substantial DC current flow is always provided through at least one of FETs 23 or 47 to the source drain path of FET 25. The amplitude of the current is controlled by the transconductance and the source gate voltage of FET 25. Because of the shunt impedance of the diode formed by FET 27, which is in shunt (for AC purposes) with the series combination of the source drain paths of FET 25 and at least one of FETs 23 or 47, there is a relatively low resistive impedance (e.g., 10–60 ohms) between terminal 62 and ground for the high frequency components of the clock pulse wave driver 50 applies to line 18 via terminal 80. Hence, the clock pulses that driver 50 supplies to terminal 80 drive a load having a short RC time constant, typically about 100 picoseconds. The previously mentioned advantages of such a short time constant are thus realized by the described circuit. Also, as previously mentioned, a resistive input impedance of receiver 52, i.e., the resistance between terminal 62 or 64 to ground, in the approximate range of 10 ohms or larger advantageously prevents the occurrence of oscillations.

Buffer 54, being constructed the same as buffer 53 but driven by clock pulses that are complementary to the clock pulses that drive buffer 53, responds to the high and low impedance states of FET 22 in the same way buffer 53 responds to the impedance states of FET 21, but at opposite times during the half cycles of clock source 48.

In operation, source 48 applies a pair complementary bi-level clock pulse trains to the gates of FETs 21 and 22. The voltages source 48 applies to the gates of FETs 21 and 22 are such as to change the resistive source drain impedances of FETs 21 and 22 between high and low levels, causing typical peak-to-peak voltage swings of about 300 millivolts to 500 millivolts to occur on lines 18 and 20. Lines 18 and 20 apply bi-level voltage variations that are substantial replicas in amplitude and wave shape of the voltages at terminals 80 and 81 to diodes formed by FETs 27 and 28.

To assist in describing the operation, assume clock wave source 48 applies to the gates of FETs 21 and 22 voltages that are respectively low and high during a first half cycle of clock source 48. The low and high voltages at the gates of FETs 21 and 22 cause the voltages at terminals 80 and 81 to be high (e.g., about 500 millivolts) and low (e.g., about 300 millivolts), respectively. The low voltage at terminal 81 is coupled with some attenuation through line 20 via terminal 64 to the gate of FET 47. Accordingly, FET 47 is forward biased to have a low source drain impedance and the voltage at terminal 66 is relatively high. The voltage at terminal 66 is somewhat less than the voltage of rail 90, being limited by the diode action of FET 23, connected between terminal 66 and rail 90.

Simultaneously, FET 25 has a relatively high source drain impedance because the high voltage at terminal 80 is coupled with some attenuation through line 18 to terminal 62 and the drain of FET 25. The relatively high voltage at the drain of FET 25 is only somewhat less than the bias voltage source 172 applies to the gate of FET 25, causing FET 25 to have a relatively high source drain impedance and supply a lower current to terminal 62 than is supplied to terminal 62 during a second half cycle of the clock wave source 48 derives, i.e., when source 48 causes the source drain impedance of FET 21 to be low. During the first half cycle the voltage and currents in FETs 23, 25, 27 and 47 cause voltage drops of about: (1) 0.5 volt across FET 27, (2) 0.5 volt across the source drain path of FET 25, and (3) 0.3 volt across the parallel combination of FETs 23 and 47. Thereby, the voltage at terminal 66 is about 1 volt above ground rail 91.

During the second half cycle of clock source 48, when the source drain impedances of FETs 21 and 22 are respectively low and high, line 20 causes a high voltage of about 0.5 volt to be developed across the diode formed by FET 28, whereby terminal 64 applies a high voltage to the gate of FET 47. The source gate voltage of FET 47 decreases in response to the high voltage at the gate of FET 47, to increase the source drain impedance of FET 47, so the voltage drop across the source drain path of FET 47 increases to about 0.5 volt. The voltage drop across the source drain path of FET 47 is limited by the diode formed by FET 23. Consequently, the current flowing from positive power supply rail 90 to terminal 66 decreases.

Simultaneously, FET 25 has a lower source drain impedance because the low voltage at terminal 80 is coupled with some attenuation through line 18 to terminal 62 and the source of FET 25. FET 25 is now forward biased to a greater extent than during the first half cycle. However, the voltage drop across the source drain path of FET 25 does not change appreciably from one half cycle to the next because the decreased source drain impedance of FET 25 is largely offset by the decreased current flow through the source drain path of FET 25, resulting from the higher source drain impedance of FET 47. Hence, during the second half cycle, the voltages and currents in FETs 23, 25, 27 and 47 cause voltage drops of about: (1) 0.3 volt across FET 27, (2) 0.5 volt across the source drain path of FET 25, and (3) 0.5 volt across the parallel combination of FETs 23 and 47. Thereby, the voltage at terminal 66 is about 0.8 volt about ground rail 91.

Consequently, the voltage variations at terminal 66 during the two half cycles of source 48 are approximately the same as the voltage variations at terminals 80 and 81. The leading and trailing edges of the voltage variations at terminal 66 occur at substantially the same time, i.e., within about 10 ps, of when the transitions at terminal 80 occur.

Similar, but complementary, operations occur in the transistors of buffer 54 during the first and second half cycles. Hence, while voltages levels of about 1.0 and 0.8 volt occur at terminal 66 of buffer 53 during the first and second half cycles of source 48, voltage levels of about 0.8 and 1.0 volt occur at terminal 68 of buffer 54 during the first and second half cycles.

Since input buffers 53 and 54 always present a low resistive impedance to the output of driver 50, the goal of skew reduction is achieved by the driver and receiver circuits of FIG. 2. More particularly, the complementary clock waves developed at output terminals 66 and 68 of buffers 53 and 54 exhibit minimum clock skew with respect to clock waves developed by source 48 and on other parts of integrated circuit chip 46.

It is desirable to (1) amplify the relatively low clock pulse voltage variations at terminals 66 and 68 to clock pulse voltages that swing almost completely between the DC power supply voltages at rails 90 and 91, and (2) substantially eliminate common mode noise coupled to the clock pulse trains propagating along lines 18 and 20 from driver 50 to receiver 52. Noise removal is especially important in the circuit of FIG. 2 where voltage swings of terminal 66 and 68 are only about 0.2 volt between adjacent half cycles of source 48. Because of these relatively low amplitude variations, the common mode noise coupled to clock lines 18 and 20 can easily adversely affect clock pulse trains derived at output terminals 66 and 68 of buffers 52 and 54. If the relatively low peak-to-peak clock pulse voltage swings at terminals 66 and 68 were to be applied to a conventional complementary inverter, the inverter would have a high likelihood of being triggered by the noise. Consequently, the clock pulses of the clock pulse wave trains would be seriously degraded and perhaps unusable. To avoid this problem, the clock circuitry of FIG. 2 includes amplifier stage 55, responsive to receiver 52. Amplifier stage 55 substantially removes common mode noise present at output terminals 66 and 68 and converts the relatively low voltage swings at terminals 66 and 68 into approximately rail-to-rail voltage swings. Amplifier stage 55 includes first and second differential amplifiers 56 and 58, both responsive to the clock pulse trains at terminals 66 and 68. Amplifiers 56 and 58 derive complementary clock pulse trains such that when amplifier 56 derives a clock pulse having a voltage almost at the high positive voltage at rail 90, amplifier 58 derives a clock pulse having a voltage almost at ground rail 91 and vice versa.

Differential amplifier 56 includes a pair of N-channel FETs 31 and 32 connected as a differential pair. The gates of FETs 31 and 32 are respectively connected to be responsive to the complementary output voltages at output terminals 68 and 66. N-channel FET 33 has its source-drain path connected between ground rail 91 and a common connection for the sources of FETs 31 and 32. The drain of FET 31 is connected to positive rail 90 through a diode formed by connecting the drain and gate of P-channel FET 29 together to form the diode anode; the diode cathode, corresponding to the source of FET 29, is connected to the positive power supply voltage at rail 90. The common connection of the drain and gate of FET 29 is connected to the drain of N-channel FET 31. The common connection of the drains of FETs 29 and 31 is connected to the gate of N-channel FET 33, having a source drain path connected to the sources of N-channel FETs 31 and 32. The source of FET 33 is connected to ground rail 91, while the drain of FET 33 is connected to the sources of FETs 31 and 32. P-channel FET 30 has a source connected to positive rail 90 and a source drain path in series with the source drain path of N-channel FET 32. The gate of FET 30 is tied to output terminal 72 of amplifier 58, having an output voltage that is complementary to the output of amplifier 56 at terminal 70. Terminal 70 is at the common drain terminals of FETs 30 and 32.

In response to the voltages at terminals 66 and 68 being respectively high and low during the previously described first half cycle of source 48, the source drain paths of FETs 32 and 31 respectively have low and high impedances. Thereby, terminal 84 at the drain of FET 31 is at a high voltage. The diode action of FET 29 prevents the voltage at the drain of FET 31 from reaching the voltage of rail 90. The high voltage at terminal 84 drives the gates of FETs 30 and 33, causing the source drain impedances of FETs 30 and 33 to be relatively high and low, respectively. Thereby, the voltages of the sources of FETs 31 and 32 decrease and the voltage of the drain of FET 32, at output terminal 70, decreases. Simultaneously, current flow from rail 90 through the source drain path of FET 30 decreases to assist in bringing the voltage at output terminal 70 of amplifier 56 toward ground. Simultaneously, differential amplifier 58 output terminal 72 supplies a high voltage to terminal 84 and the gates of FETs 30 and 33, tending to further reduce the voltages at the sources of FETs 31 and 32. The cumulative action is such that the voltage of terminal 70 quickly drops virtually to the ground potential of rail 91 so a negative going transition occurs at terminal 70 within about 110 ps of a negative going transition of clock source 48.

During the previously described second half cycle of clock source 48 when the voltages at terminals 66 and 68 are respectively low and high, FETs 32 and 31 respectively have high and low source drain impedances. Simultaneously, output terminal 72 of amplifier 58 applies a low voltage to (1) the gate of FET 30, to turn on FET 30, (2) the gate of FET 33, to turn off FET 33, and (3) the drain of FET 31. The low drain voltage of FET 31 (which is limited to a maximum deviation from the voltage of rail 90 by diode 29) is coupled through the low impedance source drain path of FET 31 to the drain of FET 33 and the source of FET 32. The cumulative action is such that the voltage at terminal 70 quickly rises virtually to the positive power supply terminal at rail 90; the timings of the positive/negative going transitions at terminal 70 relative to the transitions of clock source 48 are about the same.

The operation of differential amplifier 58 in response to positive/negative going transitions at terminals 66 and 68 is exactly as described for differential amplifier 56, except in a complementary manner because N-channel FET 36, in series with the diode-connected P-channel FET 34, is connected to respond to the voltage at terminal 66. N-channel FET 37 is connected in series to rail 90 through the source drain path of P-channel FET 35, having its gate tied to output terminal 70 of amplifier 56. N-channel FET 38 has its source drain path connected between ground rail 91 and the connected sources of FETs 36 and 37.

Differential amplifiers 56 and 58 substantially eliminate common mode noise coupled to leads 18 and 20. The common mode noise has the same polarity and substantially the same amplitude at terminals 66 and 68. These noise components are subtracted by amplifiers 56 and 58 during first half cycles of the clock output of source 48. During the other half cycles of clock source 48, the output voltages of amplifiers 56 and 58 are maintained at the positive power supply voltage of rail 90. Because the outputs of differential amplifiers 56 and 58 are unresponsive to the common mode noise components, the voltages at output terminals 70 and 72 do not change in response to the common mode noise components.

The operation of differential amplifier 56 in response to the common mode noise components is slightly different during opposite first and second half cycles of source 48. During the first half cycles while the source drain paths of FETs 21 and 22 are respectively high and low impedances, the voltages at output terminals 70 and 72 of differential amplifiers 56 and 58 are respectively low and high. The high voltage at terminal 72 turns off FET 30 and turns on FET 33. Consequently, a high impedance is provided through the source drain path of FET 30 so terminal 70 is decoupled from rail 90. The like polarity and amplitude common mode noise components at terminals 66 and 68 supplied to the gates of FETs 31 and 32 are subtracted by amplifier 56 by virtue of the common connection of the sources of FETs 31 and 32 to the drain of FET 33, such that the voltage at terminal 70 is k(A−B) where k is a proportionality constant, A and B are respectively the amplitudes of the voltages of the common mode noise components at the gates of FETs 31 and 32. Since A and B have the same polarity and substantially the same amplitudes, the voltage at terminal 70 is not changed by the common mode noise components.

During the second half cycles of source 48, while the voltages at output terminals 70 and 72 are respectively high and low, the common mode noise components are subtracted in differential amplifier 58, causing the voltage at terminal 72 to be maintained at a low value. The low voltage at terminal 72 is applied to the gate of P-channel FET 30, to turn FET 30 on, causing the power supply voltage at rail 90 to be applied to terminal 70. In addition, during these half cycles, the low voltage of terminal 72 applied to the gate of FET 33 turns off FET 33, to prevent substantial current flow through the source drain path of FET 32, to assist in maintaining the voltage at terminal 70 at the voltage of rail 90. Consequently, during the half cycles of clock source 48 when the source drain impedances of FETs 21 and 22 are respectively low and high, the common mode noise coupled to clock lines 18 and 20 does not affect the high output voltage of amplifier 56.

While there has been described and illustrated one embodiment of the invention, it will be clear that variations in the details of the embodiments specifically illustrated and described may be made without departing from the true spirit and scope of the invention as defined in the appended claims.

I claim:

1. Clock circuitry on an integrated circuit (IC) chip, the clock circuitry adapted to be responsive to a clock wave of a clock wave source, the clock circuitry comprising:

a driver having first and second outputs for respectively deriving first and second complementary clock waves in response to the clock wave;

a receiver having first and second inputs;

first and second clock lines respectively connected between said first and second outputs of said driver and said first and second inputs of said receiver, the driver, receiver and clock lines being arranged so the clock waves arrive with relatively low amplitude variations at the receiver inputs, said receiver being constructed and arranged for amplifying the clock waves having the relatively low amplitude variations at said first and second inputs to voltages substantially equal to the high and low power supply voltages of the IC chip at a first output thereof, said first output deriving an amplified clock wave having clock wave transitions substantially coincident with clock wave transitions of the clock wave of the clock save source.

2. The clock circuitry of claim 1, wherein said receiver includes a second output for deriving another amplified clock wave having voltages complementary to the voltage at said first output.

3. A circuit for removing common mode components from first and second complementary bi-level waveforms comprising first and second input terminals connected for respectively responding to the first and second waveforms, first and second DC power supply terminals, a differential amplifier connected to the first and second input terminals and to the first and second DC power supply terminals, the differential amplifier being arranged so that during first half cycles of the waveforms the common mode components are subtracted therein and during second half cycles of the waveforms an output terminal of the amplifier is supplied with one of the DC power supply voltages.

4. A circuit for removing common mode components from first and second complementary bi-level waveforms comprising first and second input terminals connected for respectively responding to the first and second waveforms, first and second DC power supply terminals, first and second differential amplifiers, each of the amplifiers being connected to the first and second input terminals and to the first and second DC power supply terminals, the first and second amplifiers respectively including first and second output terminals, the first differential amplifier being arranged so that during first half cycles of the waveforms the common mode components are subtracted therein and during second half cycles of the waveforms the first output terminal is supplied with the first DC power supply voltage, the second differential amplifier being arranged so that during the second half cycles of the waveforms the common mode components are subtracted therein and during the first half cycles of the waveforms the second output terminal of the amplifier is supplied with one of the second DC power supply voltages.

5. The circuit of claim 4, wherein each of the differential amplifiers includes first, second and third transistors having the same first conductivity type, fourth and fifth transistors having the same second conductivity type, each of the transistors including a control electrode and a path having an impedance controlled by voltage at the control electrode, the paths of the first and fourth transistors being connected in series to form a first branch, the paths of the second and fifth transistors being connected in series to form a second branch, one end of each of the first and second branches being connected to a first power supply terminal, a second end of each of the first and second branches being connected to the path of the third transistor, the control electrodes of the first and second transistors of the first differential amplifier being respectively connected to voltages at first and second input terminals, the control electrodes of the first and second transistors of the second differential amplifier being respectively connected to be responsive to the voltages at the second and first input terminals.

6. The circuit of claim 5, wherein the control electrodes of the third, fourth and fifth transistors of each of the differential amplifiers are connected together, and the fourth transistor of each of the differential amplifiers is connected as a diode.

7. The circuit of claim 6, wherein a terminal between the paths of the first and fourth transistors of the first amplifier is connected to be at the same potential as a terminal between the paths of the second and fifth transistors of the second amplifier and a terminal between the paths of the first and fourth transistors of the second amplifier is connected to be at the same potential as a terminal between the paths of the second and fifth transistors of the first amplifier.

* * * * *